United States Patent [19]
Fick et al.

[11] 3,940,534
[45] Feb. 24, 1976

[54] ELECTRICAL LAMINATE

[75] Inventors: Herbert J. Fick, Northfield; Edward J. Mahagnoul, Faribault, both of Minn.

[73] Assignee: G. T. Schjeldahl Company, Northfield, Minn.

[22] Filed: Aug. 5, 1974

[21] Appl. No.: 494,771

Related U.S. Application Data

[63] Continuation-in-part of Ser. No. 413,695, Nov. 7, 1973, abandoned.

[52] U.S. Cl. .............. 428/228; 156/182; 156/228; 156/309; 174/68.5; 427/96; 428/239; 428/251; 428/285; 428/430; 428/458; 428/901; 428/910
[51] Int. Cl.² ........................................ B32B 17/12
[58] Field of Search ............. 161/93, 150, 151, 156, 161/166, 194, 213, 214, 403, 402, DIG. 4, DIG. 7; 117/201, 217; 156/228, 309, 182, 272; 174/68.5; 260/33 A; 428/901, 228, 910, 239, 251, 268, 285, 337, 430, 458; 427/96

[56] References Cited
UNITED STATES PATENTS

| | | |
|---|---|---|
| 2,969,300 | 1/1961 | Franz............................ 161/DIG. 7 |
| 3,335,050 | 8/1967 | Makowski et al................... 161/217 |
| 3,340,606 | 9/1967 | Anderson et al. ............. 161/DIG. 7 |
| 3,463,698 | 8/1969 | Yanagihara et al................. 156/228 |
| 3,681,474 | 8/1972 | Lombardi et al. ............. 260/33.6 A |

*Primary Examiner*—George F. Lesmes
*Assistant Examiner*—James J. Bell
*Attorney, Agent, or Firm*—Orrin M. Haugen

[57] ABSTRACT

A mechanically sound electrically stable substrate for use in an electrical laminate wherein the substrate supports at least one electrically conductive metallic layer. The substrate portion comprises a woven glass cloth base pad which is interposed between a pair of outer substrate layers of a polyester mat. The polyester mat comprises a mat of spunbonded continuous filament polyester fibers, preferably polyethylene terephthalate fibers, calendered, with the fibers including a mixture of bulk fibers of relatively high melting point retained in place or bonded by a binder fiber of essentially the same polyester material but with a relatively lower melting point. In fabrication, the mat, along with the glass cloth, is saturated with a curable resin, for example a heat curable resin, preferably polybutadiene, which is cured in-situ.

8 Claims, 5 Drawing Figures

ELECTRICAL LAMINATE

CROSS-REFERENCE TO RELATED APPLICATION

The present application is a Continuation-in-Part of our co-pending application Ser. No. 413,695, filed Nov. 7, 1973, entitled "ELECTRICAL LAMINATE", now abandoned and assigned to the same assignee as the present application.

BACKGROUND OF THE INVENTION

The present invention relates generally to an improved electrical laminate system, and more specifically to an improved electrical laminate utilizing a substrate having desirable physical, chemical and electrical properties. The substrate comprises, in combination, a woven glass cloth base pad interposed, preferably along the neutral plane, between a pair of outer substrate layers of polyester mat. The glass cloth is a conventional woven glass cloth while the mat layers disposed along the surfaces include a mat of spunbonded continuous filament polyester fibers including primarily fibers having a predominately thermoplastic characteristic with some modest thermoset characteristics, the thermoplastic fibers being utilized to bind the thermoset fibers in place in the mat. The polyester fibers hold the glass cloth out of contact with the electrical conductors.

The laminate structure further includes an impregnating or bonding resin, with the resin being employed to substantially saturate or impregnate the interstices of the laminate in order to provide solvent resistance, mechanical durability, rigidity, and also to enhance the chemical, physical and electrical properties. When a selfextinguishing or flame-retardant product is required, combinations of antimony oxide with highly chlorinated hydrocarbons and/or antimony oxide with brominated compounds may be employed as fillers.

In the preparation of electrical laminate materials, such as those electrical laminate materials which are designed for use as either printed wiring or printed circuitry devices, or the like, it is normally necessary to provide a substrate member between opposed metallic sheet members so as to provide a laminate having sound mechanical and chemical properties, to permit exposure of the structure to manufacturing operations including chemical etching, high temperature soldering and the like, and also to provide a finished product with desirable electrical properties. The substrate material must, therefore have electrical properties including high resistivity, and also proper dielectric strength.

In the past, it has been conventional to provide substrate materials which will provide either a flexible or a rigid laminate substance. For flexible materials, layers of films of stress oriented polyethylene terephthalate, such as that certain film sold by E. I. DuPont deNemours Corporation of Wilmington, Delaware under the name "Mylar" or other thin flexible films have been employed to support one or more surface layers of metallic electrical conductors. These substrate materials have found considerable utility and acceptance in the electrical field.

For rigid circuitry, either single or double-sided, it has been conventional to employ layers of phenolic-glass, phenolic-canvas, or other resinous materials such as epoxy resins with similar reinforcement materials, as well as other combinations to provide a rigid, durable board. Obviously, it is important to control the electrical properties of the supporting substrate so as to render them compatible with the ultimate end application of the laminate.

SUMMARY OF THE INVENTION

The substrate material of the present invention provides a laminate material susceptible of continuous production, with the technique providing a generally flexible laminate having the physical characteristics of a flexible electrical laminate, and the temperature and dimensional stability of a rigid electrical laminate board. As such, the material finds considerable application in the printed circuitry field.

Briefly, in accordance with the present invention, an electrical laminate is formed which includes a pair of opposed electrically conductive metallic layers disposed on opposite sides of a substrate surface. The substrate portion comprises a woven glass cloth base pad interposed between a pair of outer substrate layers of polyester mat, preferably along the neutral plane of the system. The woven glass cloth base pad is a weave of filamentary glass yarn or fibers of modest thickness, with the polyester mat comprising a calendered mat of spunbonded continuous filament polyester fibers, with the entire substrate material being impregnated with a heat curable synthetic resin, preferably a polybutadiene mixture which comprises in its unsaturated portion, a significant amount of 1,2-polybutadiene.

The butadiene monomer has the chemical structure:
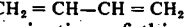
Polymerization of this monomer normally leads to a polymer having the following repeating units:

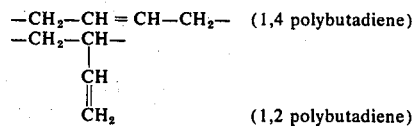

According to some procedures, a cyclicized repeating unit is formed having the following repeating structural unit:

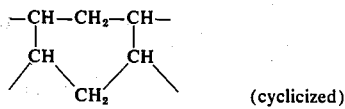

Each of these various repeating units may be present in the polybutadiene resin in varying amounts. A large number of such resins are, of course, commercially available.

Examples of such resins are found disclosed in U.S. Pat. No. 3,686,158, while other patents such as U.S. Pat. No. 3,786,087 and 3,786,009 disclose techniques for preparing typical polybutadiene resins. A large number of such resins may be suitably employed in connection with the preparation of products pursuant to the present invention.

Therefore, it is a primary object of the present invention to provide an improved electrical laminate which includes a pair of opposed outer electrically conductive metallic layers disposed upon an intervening substrate layer, with the substrate layer being moderately flexible and having enhanced electrical, chemical and physical properties.

It is yet a further object of the present invention to provide an improved electrical laminate having a pair of opposed layers or sheets of a metallic conductor arranged on opposite sides of a substrate layer, with the substrate layer consisting essentially of a layer of woven glass cloth interposed between layers of spunbonded continuous filamentary fiber polyester mat material, the substrate substance being modestly compressed and substantially entirely impregnated with curable resin consisting primarily of 1,2-polybutadiene.

Other and further objects of the present invention will become apparent to those skilled in the art upon a study of the following specification, appended claims, and accompanying drawings.

DESCRIPTION OF THE PREFERRED EMBODIMENT

Figure 1:
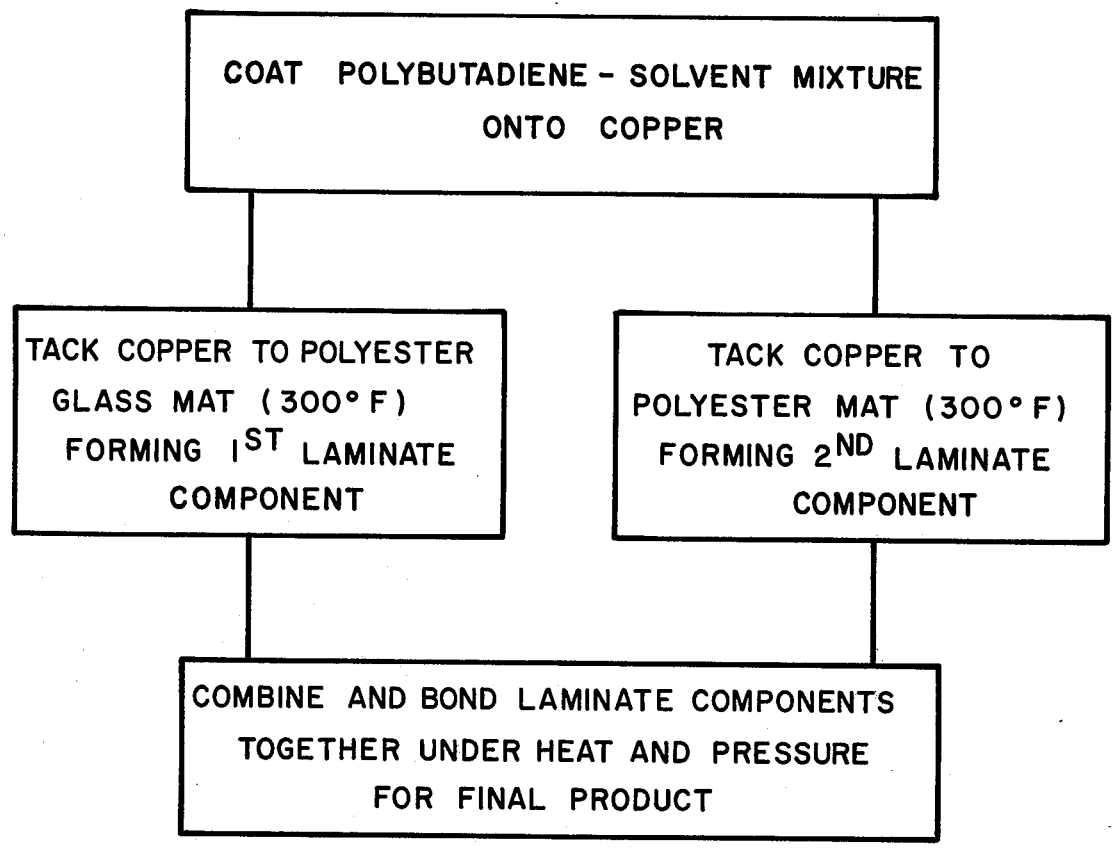
FIG. 1 is a flow diagram illustrating the various steps involved in carrying out the preparation of a product pursuant to the preferred embodiment of the present invention.

In accordance with the preferred embodiment of the present invention, a laminate having the following arrangement of component layers is prepared:

1. Sheet copper (1 oz.) having an adherent oxide film on the inner surface thereof;
2. Polyester mat;
3. Woven glass cloth;
4. Polyester mat; and
5. Sheet copper (1 oz.) having an adherent oxide film on the inner surface thereof.

These individual component layers are held together by a resinous material, preferably such a material consisting essentially of polybutadiene.

THE METALLIC CONDUCTOR LAYER

As has been indicated hereinabove, a layer of a metallic conductor is disposed on the outer surface of the laminate. This material is preferably copper, although it will be appreciated that other conductive metals such as aluminum or the like may be employed if desired. The copper, when employed, is also preferably treated so as to enhance its bondability to the laminate system.

Oxide treated copper is preferably utilized, this material being commercially available, and being oxide treated along one surface thereof. Oxide treated copper is available commercially, such as, for example, that certain copper identified by the code name "Treatment A", by Yates Industries of Bordentown, New Jersey. For most electrical purposes, one ounce copper may be employed, although, of course, the application may dictate that other thicknesses of copper be utilized. Copper foil, either rolled or electro-deposited, is available in a wide variety of gauges, with those of from 1 ounce to 3 ounce material being widely commercially utilized.

THE POLYESTER MAT

The polyester mat material is utilized to contribute to the flexibility of the material, and also to enhance the electrical properties of the substrate. The mat material is preferably fibrous polyester of spunbonded continuous filamentary fiber, preferably an oriented polyethylene terephthalate polyester fiber, such as "Dacron" which is available from E. I. DuPont deNemours Corporation of Wilmington, Delaware, mixed with a second lower melting, primarily thermoplastic polyester material, the second material being, for example, non-oriented polyethylene terephthalate. The combination of fibers provides a finished product which may be described as a randomly arranged array of oriented fibers.

The bulk of the polyester mat material consists of a material which is primarily oriented fibers. Oriented polyethylene terephthalate fibers have a somewhat higher melting point than non-oriented fibers, and preferably comprise between about 85–92% of the entire polyester mat, with 88% being considered most preferable. The lower melting material, which is essentially non-oriented polyethylene terephthalate fiber, comprises the balance. Other lower melting fibers of polyester material may be utilized.

The polyester mat material is preferably random in its fiber orientation, and has a thickness of approximately 6 to 7 mils, with a weight of approximately 20 grams per square yard. The individual spunbonded fibers are normally between about 3½ to about 4 denier. Polyester mat material of this type is available commercially from the E. I. DuPont deNemours Corporation of Wilmington, Delaware under the code name "Remay 2011". Calendered polyester mat material of this type is also commercially available and may be prepared by exposure of the "Remay 2011" material to a calender under modest pressure (i.e. 300 psi) until the cross-sectional thickness is reduced from about 6 to 7 mils to about 2 to 3 mils.

The polyester mat material may be a calendered version of the loosely packed material, with commercially available versions having a nominal thickness of about 2.5 mils. The preferred mat material has a composition which includes 88% thermosetting fibers, with 12% thermoplastic fibers. Such material has a capability of withstanding temperatures in the range of approximately 400° F.

WOVEN GLASS CLOTH

The glass cloth component preferably has a thickness of about 2 to 2½ mils, and is preferably of a plain weave. One material which has been found desirable has a weave with 60 ends and 47 picks per inch. Such material is, of course, commercially available having either 1 or 2 fibers per strand. Specific glass cloth weaves which have been found useful are Standard Style No. 108, No. 1080, as well as others. These materials have a weight of approximately 1.4 ounces per square yard, and of course, weaves of from 40 to 80 ends as well as from 35 to 60 picks may be utilized.

The glass cloth has an extremely low elongation, ranging from less than about 3% to 4% of elongation. The tensile strength of the cloth is in the range of about 200,000 psi, with some strengths as high as 400,000 psi, with the modulus being in the range of approximately $10 \times 10^6$.

The finish applied to the glass material has been found to be helpful in certain instances. Silane-treated glass, such as vinyl triacetoxysilane treated glass has been found desirable. Vinyl-tris (beta-methoxyethoxy) silane has also been used. This treatment on the glass cloth appears to improve wetting characteristics, as well as to improve humidity aging and humidity surface insulation resistance.

Glass cloth which has been scoured and either heat-set or heat-cleaned may also be employed, it also being desirable that such heat-treated glass cloth be subsequently coated with the silane material referred to above. Such heated and treated cloth is, of course, commercially available.

RESIN

As has been indicated, the entire laminate structure is impregnated with a curable resin preferably dispersed or retained in a solvent mixture. The preferred resin from chemical, electrical and mechanical considerations is polybutadiene, with this material also being commercially available. The polybutadiene is normally retained in a solvent, toluene, along with a curing agent, for example organic peroxides, with about 2% up to about 10% of such an oxide, normally dicumylperoxide, based on resin solids being preferred. Normally, the dicumylperoxide is dispersed in substantially equal parts of toluene for dispersal in the resin-solvent mixture.

In the polybutadiene resins, a 1,2 vinyl content of from between about 40% and up to 90% or more may be employed. In the higher vinyl content materials, the balance of 10% is normally 1,4 combined cis and trans versions.

As has been previously indicated, the polybutadiene resins employed may preferably contain a significant amount of 1,2-polybutadiene. This is the vinyl portion of the resin polymer, and is normally described as such. The remaining portion is the 1,4-polybutadiene, which is present in either the cis or trans form. As the proportion of vinyl, 1,2-polybutadiene decreases, the quantity of curing agent, such as dicumylperoxide is normally increased. Thus, for a resin containing 45% 1,2-polybutadiene, balance of 55% 1,4-polybutadiene, approximately 9 to 10 parts of dicumylperoxide is required per 100 parts of resin. The same quantity of curing agent may be required if the resin contains 45% 1,2-polybutadiene, 25% 1,4-polybutadiene, 30% cyclic with pendant vinyls thereon.

Polybutadiene resins having an average molecular weight ranging from approximately 1,000 up to about 30,000 may be employed, with those materials having a molecular weight in the range of about 20,000 having been found to be particularly useful. A highly useful range may be from about 2,000 up to about 20,000. For consistency in the final product, it is normally preferable for the molecular weight range of the individual components to be within a relatively narrow range, so as to avoid plasticization of the product.

It will be appreciated that other resin substances may be employed, the requirement being that the resin selected be curable under heat and pressure. In addition to 1,2-polybutadiene, other resins such as epoxy resin, as well as polyester resins or melamines may be found useful.

THE LAMINATION OPERATION

In order to prepare one typical laminate, a polybutadiene-solvent mixture is coated onto the copper to a layer of approximately 5 to 6 mils. The polybutadiene is one having a vinyl content of 90%, with the 10% balance being a mixture of cis and trans 1,4-polybutadiene. The average molecular weight of this material is approximately 20,000, with a fairly narrow range of molecular weight materials being incorporated in the resin to provide this finished product. Such polybutadiene resins are commercially available, and may be prepared by the techniques disclosed in U.S. Pat. No. 3,786,009. A curing agent, dicumylperoxide, in an amount of 2 parts of dicumylperoxide per 100 parts of resin solids being employed. The dicumylperoxide is dispersed in substantially equal parts of toluene for achieving dispersal in the resin-solvent mixture.

The coated material is then tacked to the polyester mat material at a temperature of about 300° F. This temperature is selected since it is below any temperature at which the material has a significant curing rate, but is sufficiently high to drive off the solvent, toluene, without picking up substantial quantities of oxygen. This material can be treated by merely placing the material on a heated surface, or by oven drying. In this particular operation, one of the copper sheets is tack-bonded to one polyester mat, while the other copper sheet is tack-bonded to the polyester mat component of a prelaminate of polyester mat and woven glass cloth.

Following the tacking between the copper and the polyester and/or polyester-glass mat to form first and second laminate components, these components are combined and bonded together in a second laminating operation. With the copper layers on the outside, the components are placed in face-to-face relationship and subjected to simultaneous heat and pressure, such as in a platen press or within the nip of a pair of heated laminating belts.

Figure 5:
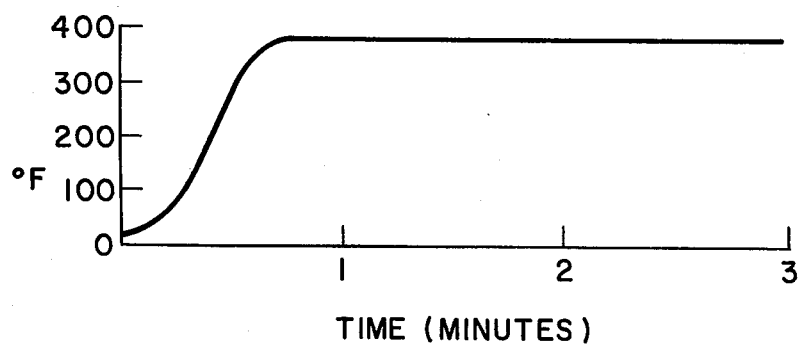
FIG. 5 is a plot of the time versus temperature profile of the product as it passes through the laminator during the final bonding operation.

The temperature within the press is increased rapidly from room temperature to about 380° F. and held at that temperature for a period of approximately 3 minutes. Somewhat longer cure times at lower temperatures may be utilized, for example, 360° F. for 6 minutes. It is preferred that a system be employed wherein the temperature is increased from room temperature at a rate such as is illustrated in FIG. 5, with the initial introduction of the material into the press occurring at approximately 120° F. to 200° F. A desirable method for laminating the product is set forth in that certain co-pending patent application of Herbert J. Fick, et al entitled "METHOD OF PREPARING ELECTRICAL LAMINATE HAVING POLYESTER MATGLASS CLOTH SUBSTRATE", Ser. No. 413,694, filed Nov. 7, 1973, and assigned to the same assignee as the present application.

The combining force employed preferably is between 15 and 45 psi, with a combining force of approximately 30 psi being preferred.

If pressures less than approximately 15 psi are employed, the force is sufficiently weak so as to provide a finished product of limited durability. If pressures of greater than about 45 psi are employed, the resin mixture may be extruded from between the layers, thereby permitting some non-uniform properties to develop. When non-calendered polyester mat is employed, somewhat higher unit pressures may be employed. For the normally non-calendered polyester mat materials, exposures to unit pressures of approximately 100 psi may be appropriate for a period of time sufficient to reduce the overall thickness of the polyester mat portion from, for example, about 6 to 7 mils thickness down to about 2.5 mils.

USE OF FILLERS

As has been indicated, fillers may be employed in the resin mixture so as to enhance the characteristics of the finished product. Antimony oxide with chlorinated hydrocarbons and/or brominated resins may be employed to provide flame-retardancy or self-extinguishing characteristics. The addition of the silane material referred to hereinabove to the resin has been found to improve the wetting of the fillers by the resin and the adhesion of the resin to the fillers as well as the glass cloth surface.

Figure 2:
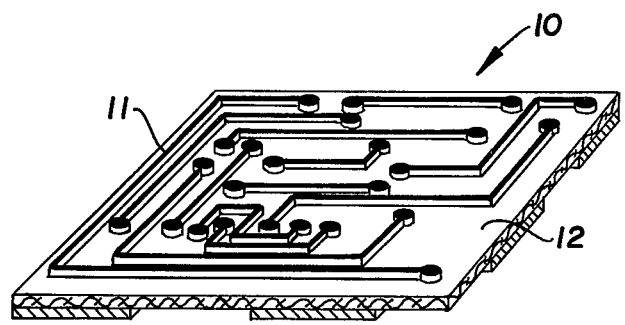
FIG. 2 is a perspective view, partially in section, and showing a finished printed electrical circuit prepared on the electrical laminate substance of the present invention.
Figure 3:
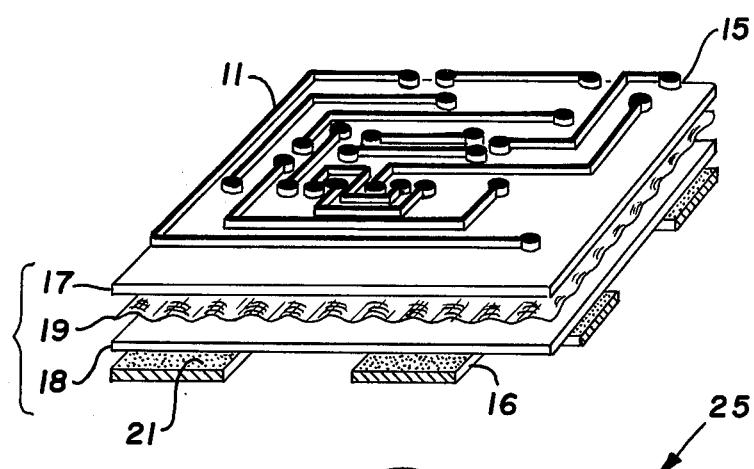
FIG. 3 is a detail perspective view, with the individual layers of the laminate shown in exploded disposition, with the arrangement being similar to that illustrated in FIG. 2.
Figure 4:
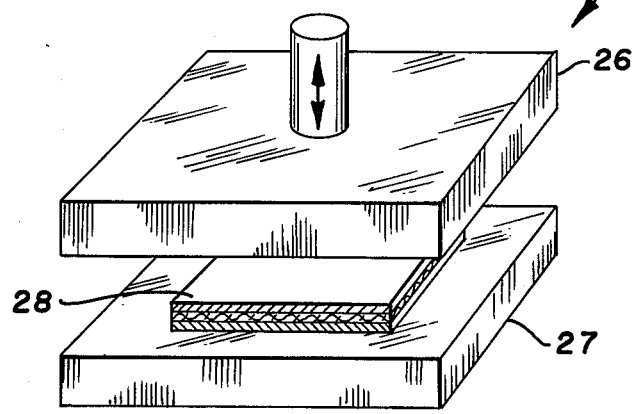
FIG. 4 is a perspective view of a simple platen laminator which may be utilized in laminating the components together to form the improved laminate of the present invention.

With attention now being directed to FIGS. 2 and 3 of the drawings, it will be seen that the laminate product generally designated 10 includes an electrical circuit configuration with copper conductors as at 11, the conductors being disposed on the surface of substrate 12. Substrate 12 is shown in better detail in FIG. 3, which is an exploded view of the laminate utilized in the preparation of the circuit product as at 10. In this system, the copper sheets 15 and 16 are secured to the surface of the substrate so as to provide a durable laminate structure. The substrate includes the polyester mat members 17 and 18, which are arranged on opposite sides of the woven glass cloth member 19.

The copper members 15 and 16 each have an oxide film adherently arranged thereon, as at 21 for example, with this oxide layer enhancing the adhesion between the copper surface and the substrate.

The laminator arrangement which may typically be used is illustrated generally at 25, with platens 26 and 27 being employed to provide a nip such as is shown generally at 28. Motion is provided for the platen as indicated. Platen laminators of this type are, of course, commercially available.

As has been indicated, it is preferred that the belt be substantially at 120° F. to 200° F. upon receiving the initial charge of laminate material. With the resin already being tacked to the substrate components, the individual materials are then effectively "wet" by the resin. The polybutadiene is a good impregnate for the glass and improves the electrical properties of the composite arrangement. As has been indicated, however, resins which cure under heat and pressure may be suitable for this particular process.

In the resin mixture employed, approximately 50 to 80% by weight of solids are preferred, balance toluene solvent, with a range of from 70 to 75% being specifically preferred. Such resin mixtures are, of course, readily commercially available.

We claim:

1. In laminate means for electrically isolating and supporting an electrically conductive metallic layer; the laminate consisting of at least one electrically conductive layer disposed upon a substrate surface, the substrate portion comprising, in combination:
   a. woven glass cloth base pad means interposed between a pair of outer substrate layers of polyester mat, said woven glsss cloth consisting essentially of glass filamentary fibers with a thickness of between about 1 and 5 mils, and woven together to form a fabric;
   b. said polyester mat comprising a mat of spun-bonded continuous filamentary polyester fibers with the fibers having a bulk fiber content of between about 85% to 92% of first polyester fibers consisting essentially of oriented polyethylene terephthalate with a certain first melting point, balance of a second thermoplastic polyester fibers consisting essentially of non-oriented polyethylene terephthalate and having a significantly lower melting point than said first polyester fibers, and with said polyester mat having a weight of between about 20 and 30 grams per square yard.

2. The laminate means as defined in claim 1 being particularly characterized in that said electrically conductive layers are bonded to said substrate by a synthetic resin consisting essentially of a mixture of 1,2-polybutadiene and 1,4-polybutadiene in the polymer chain.

3. The laminate means as defined in claim 1 being particularly characterized in that the filamentary fibers comprising said woven glass cloth are coated with a film of a silane selected from the group consisting of vinyl triacetoxysilane and vinyl-tris (betaethoxymethoxy) silane.

4. The laminate means as defined in claim 2 being particularly characterized in that the filamentary fibers comprising said woven glass cloth are coated with a film of silane selected from the group consisting of vinyl triacetoxysilane and vinyl-tris (betaethoxymethoxy) silane.

5. The laminate means as defined in claim 1 being particularly characterized in that said laminate is secured together by a resin curable under heat and pressure and selected from the group consisting of polybutadiene, epoxy, polyester, and melamine.

6. The laminate means as defined in claim 1 being particularly characterized in that said polyester mat consists of a mixture of at least two polyester fibers having distinctly different melting points, wherein the lower melting polyester fiber is a binder and contained in said mat in a quantity ranging from between about 5 and 15%.

7. The laminate means as defined in claim 1 being particularly characterized in that said substrate layers and said electrically conductive layers are bonded together by a synthetic resin consisting essentially of polybutadiene, said polybutadiene containing between about 45% and 90% 1,2-polybutadiene, balance 1,4-polybutadiene, said synthetic resin having an average molecular weight of between about 2,000 and 20,000.

8. In laminate means for electrically isolating and supporting an electrically conductive metallic layer; the laminate consisting of at least one electrically conductive layer disposed upon a substrate surface, the substrate portion comprising, in combination:
   a. a woven glass cloth base pad having a high modulus of elasticity in the range of approximately 10 × $10^6$ and a tensile strength ranging from between about 200,000 psi to 400,000 psi, and being interposed between a pair of outer substrate layers of polyester mat, said woven fiber being bonded directly to said polyester mat;
   b. said polyester mat comprising a mat of spun-bonded continuous filamentary polyester fibers with the fibers having a bulk fiber content of between about 84% to 92% of first polyester fibers consisting essentially of oriented polyethylene terephthalate and having a certain first melting point, the balance being binder polyester fibers consisting essentially of non-oriented polyethylene terephthalate and with a certain second and significantly lower melting point than said first polyester fibers, and with said mat having a weight of between about 20 and 30 grams per square yard.

* * * * *